(12) United States Patent
Koo et al.

(10) Patent No.: US 11,291,129 B2
(45) Date of Patent: Mar. 29, 2022

(54) ELECTRONIC DEVICE HAVING METAL CASE AND METAL CASE USED FOR SAME

(71) Applicant: Samsung Electronics Co., Ltd., Gyeonggi-do (KR)

(72) Inventors: Ja-myeong Koo, Gyeonggi-do (KR); Young-chul Lee, Gyeonggi-do (KR); Young-jun Moon, Gyeonggi-do (KR); Jeong-gen Yoon, Gyeonggi-do (KR); Soon-min Hong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/769,436

(22) PCT Filed: Aug. 16, 2016

(86) PCT No.: PCT/KR2016/008922
§ 371 (c)(1),
(2) Date: Apr. 19, 2018

(87) PCT Pub. No.: WO2017/073893
PCT Pub. Date: May 4, 2017

(65) Prior Publication Data
US 2018/0310423 A1    Oct. 25, 2018

(30) Foreign Application Priority Data
Oct. 26, 2015   (KR) .................. 10-2015-0148911

(51) Int. Cl.
*H05K 5/04* (2006.01)
*B32B 15/08* (2006.01)
(Continued)

(52) U.S. Cl.
CPC ............... *H05K 5/04* (2013.01); *B32B 15/08* (2013.01); *H01Q 1/24* (2013.01); *H01R 13/03* (2013.01); *H01R 13/24* (2013.01)

(58) Field of Classification Search
CPC ...................................... H05K 5/00
See application file for complete search history.

(56) References Cited

U.S. PATENT DOCUMENTS

| | | | |
|---|---|---|---|
| 3,439,231 A * | 4/1969 | Booe ................. | H01G 2/12 361/536 |
| 6,544,047 B2 | 4/2003 | Moore | |

(Continued)

FOREIGN PATENT DOCUMENTS

| | | |
|---|---|---|
| CN | 101471520 A | 7/2009 |
| CN | 101802541 A | 8/2010 |

(Continued)

OTHER PUBLICATIONS

European Search Report dated May 16, 2019.
(Continued)

*Primary Examiner* — Jerry Wu
(74) *Attorney, Agent, or Firm* — Cha & Reiter, LLC.

(57) ABSTRACT

The present invention relates to an electronic device having a metal case, the electronic device comprising: a metal case having at least one electronic circuit or antenna formed therein; a metal pad arranged at the metal case and electrically connected to the at least one electronic circuit or antenna; a metal sheet attached to one surface of the metal pad; and an electronic circuit board electrically connected to the at least one electronic circuit or antenna of the metal case through a metal instrument for connection which detachably contacts the metal sheet.

4 Claims, 15 Drawing Sheets

(51) Int. Cl.
*H01R 13/03* (2006.01)
*H01R 13/24* (2006.01)
*H01Q 1/24* (2006.01)

(56) References Cited

U.S. PATENT DOCUMENTS

| | | | |
|---|---|---|---|
| 6,913,468 B2 | 7/2005 | Dozier, II et al. | |
| 8,587,485 B2 | 11/2013 | Tahk et al. | |
| 8,770,987 B2 | 7/2014 | Horikawa | |
| 9,450,294 B2 | 9/2016 | Cho et al. | |
| 2002/0046879 A1* | 4/2002 | Barabash | H01Q 1/48 174/258 |
| 2006/0267036 A1* | 11/2006 | Lee | H01L 33/647 257/98 |
| 2007/0025765 A1* | 2/2007 | Akagawa | G03G 15/04072 399/139 |
| 2007/0222379 A1* | 9/2007 | Yamazaki | H01L 33/42 313/509 |
| 2011/0227178 A1* | 9/2011 | Kazama | G01L 1/18 257/417 |
| 2015/0042528 A1* | 2/2015 | Jung | H01Q 1/526 343/787 |
| 2015/0061941 A1 | 3/2015 | Hill et al. | |

FOREIGN PATENT DOCUMENTS

| | | |
|---|---|---|
| CN | 104934690 A | 9/2015 |
| EP | 2 913 935 A1 | 9/2015 |
| JP | 2001-298259 A | 10/2001 |
| JP | 2009-200236 A | 9/2009 |
| JP | 2012-44008 A | 3/2012 |
| KR | 10-1123515 B1 | 3/2012 |
| KR | 10-2013-0014784 A | 2/2013 |
| KR | 10-2014-0061085 A | 5/2014 |
| KR | 10-1394459 B1 | 5/2014 |
| KR | 10-2015-0045180 A | 4/2015 |
| KR | 10-1552155 B1 | 9/2015 |

OTHER PUBLICATIONS

European Search Report dated Jul. 27, 2018.
Chinese Search Report dated Oct. 30, 2019.
European Search Report dated Feb. 12, 2020.
Chinese Search Report dated Jun. 2, 2020.
Korean Search Report dated Dec. 14, 2021.

\* cited by examiner

ELECTRONIC DEVICE HAVING METAL CASE AND METAL CASE USED FOR SAME

CLAIM OF PRIORITY

This application is a National Phase Entry of PCT International Application No. PCT/KR2016/008922, which was filed on Aug. 16, 2016 and claims a priority to Korean Patent Application No. 10-2015-0148911, which was filed on Oct. 26, 2015, the contents of which are incorporated herein by reference.

DESCRIPTION OF DRAWINGS

TECHNICAL FIELD

The present invention relates to an electronic device having a metal case which is partially or wholly used as an electronic circuit or an antenna, and more particularly, to an electronic device having a metal case having a structure capable of preventing corrosion of a metal pad of the metal case which is in contact with a metal member for connection of an electronic circuit board or preventing damage to the metal pad of the metal case due to friction that occurs between the metal member for connection and the metal pad during an assembly process and an usage and a metal case used for the same.

BACKGROUND ART

There is an increasing number of electronic devices using a metal case formed of a pure metal of one of aluminum, titanium, zinc, magnesium and the like, or an alloy containing at least one of them. Such a metal case is widely used because the metal case can increase the structural rigidity of an electronic device so that it is easier to make the electronic device lighter and thinner than conventional electronic devices, and at the same time can express a high-quality texture of a metal.

In the case in which a metal case is used, since the metal absorbs radio waves, the performance of an antenna disposed inside the metal case may be degraded or the installation position of the antenna may be limited. On the other hand, since mobile electronic devices use various frequency bands, it is necessary to use various antennas suitable for the frequency bands. Therefore, in order to solve this problem, the metal case is formed as an antenna or a part of an electronic circuit.

However, when at least one antenna or component of an electronic circuit is formed in the metal case, it is necessary to be electrically connected to an electronic circuit board provided inside the metal case.

Figure 1:
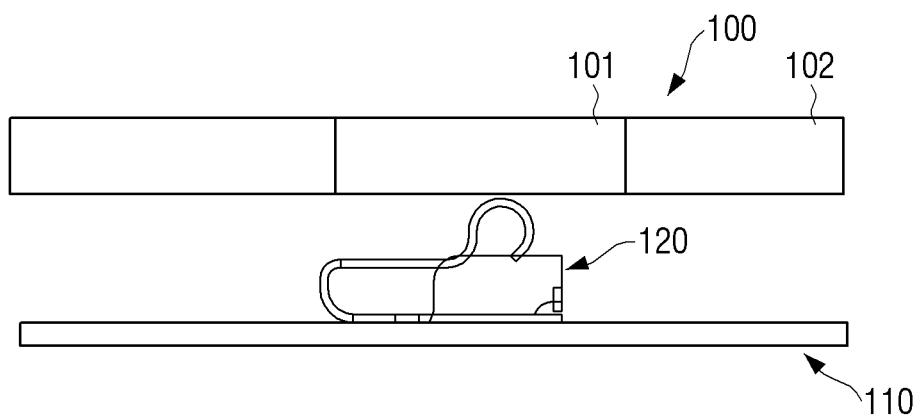

For this purpose, a metal part 101 of a metal case 100 and an electronic circuit board 110 are connected to each other by using a contact terminal such as a C-clip 120 disposed on the electronic circuit board 110 as illustrated in FIG. 1. In FIG. 1, a reference numeral 102 denotes a polymer insulating the metal pad 101.

However, in the case of the metal which is currently mainly used as the material of the metal case 100, such as aluminum, magnesium, titanium, zinc, iron, stainless steel and the like, when a gold plated contact portion like the C-clip 120 disposed on the electronic circuit board 110 is in direct contact with the metal pad 101 of the metal part of the metal case 100 constituting an antenna, galvanic corrosion, fretting corrosion, or the like may occur, so that the antenna performance may be degraded or malfunction of the electronic device may occur due to contact failure.

Various methods are proposed and used to solve the problems of the metal case 100 according to the related art.

Figure 2:
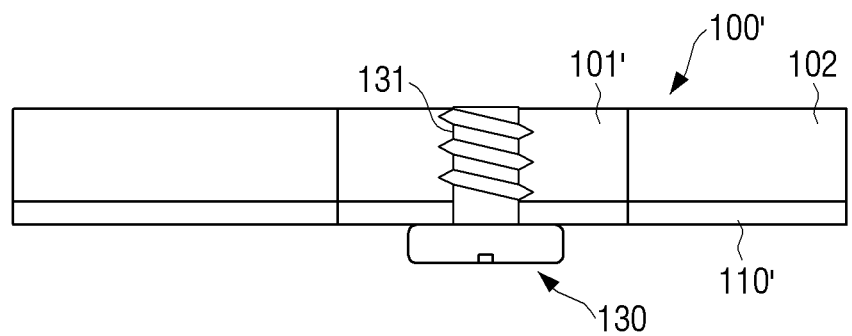

As an example of the prior art for solving the above problems, as illustrated in FIG. 2, a terminal portion of an electronic circuit board 110' and a metal pad 101' of a metal case 100' may be directly connected to each other with a screw 130 or a bolt. Such a structure may prevent galvanic corrosion or fretting corrosion from occurring in the terminal portion 101' of the metal case 100'. However, in this method, since the electronic circuit board 110' is coupled to the metal case 100' by using the small screw 130 or bolt, a small screw hole 131 for screwing the screw 130 or the bolt is required to be machined on the metal pad 101' of the metal case 100'. Therefore, the machining cost may be increased, and a minimum thickness for the screw 130 or the bolt is required so that it may be limited to reduce the thickness of the metal case 100'.

Figure 3:
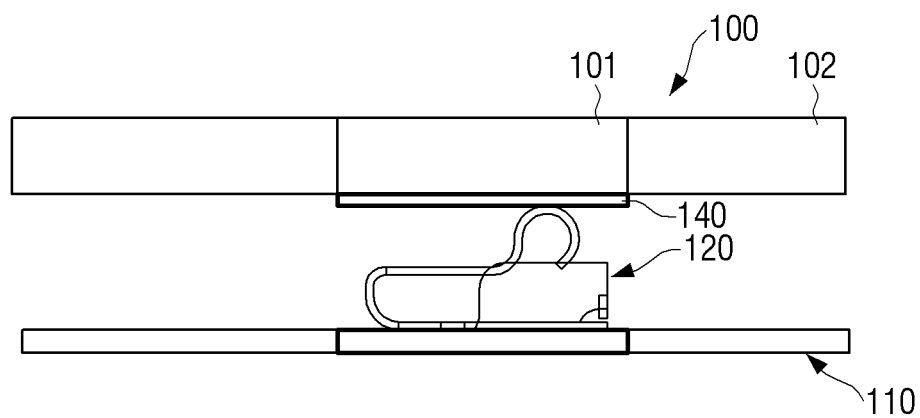

As another example of the prior art for solving the above problems, as illustrated in FIG. 3, a conductive tape 140 may be attached to a metal pad 101 of a metal case 100 so that the conductive tape 140 is positioned between the metal pad 101 of the metal case and a C-clip 120 of an electronic circuit board 110. The conductive tape 140 is composed of a conductive adhesive that can be attached to the metal pad and a film plated with one of gold, nickel, silver, and platinum. However, the conductive tape 140 has a problem that the reliability of the adhesive is low. Further, since the conductive tape 140 is attached to the metal pad of a small size of the metal case 100, there is a problem in that the metal case 100 using many metal pads 101 is poor in mass productivity. Further, in this example, since the conductive tape 140 having a thickness of 0.15 mm or more is provided between the metal case 100 and the C-clip 120 of the electronic circuit board 110, the thickness of the electronic device may be increased.

Figure 4:
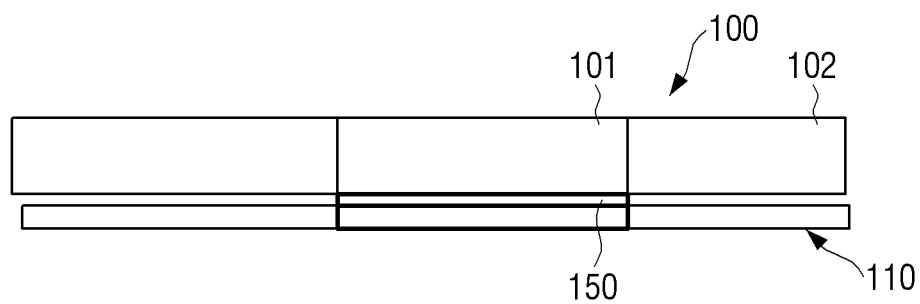

As another example of the prior art for solving the above problems, as illustrated in FIG. 4, a metal pad 101 of a metal case 100 and a terminal portion of an electronic circuit board 110 are connected to each other by using a double-sided conductive tape 150. Since such a method does not use a C-clip of the electronic circuit board 110, there is an advantage that the thickness of the joint portion may be reduced. However, since the double-sided conductive tape 150 is attached to the metal pad of a small size of the metal case 100, there is a problem in that the metal case 100 using many metal pads is poor in mass productivity. Further, there is a problem in that repair is difficult when the electronic device is defective.

DISCLOSURE

The present disclosure has been developed in order to overcome the above drawbacks and other problem. An aspect of the present invention relates to an electronic device using a metal case having a structure capable of preventing galvanic corrosion or fretting corrosion from occurring when a metal member for connection such as a C-clip is used to connect an electronic circuit board and a metal pad of the metal case a part of which is used as an antenna or a part of an electronic circuit and a metal case used in the electronic device.

According to an aspect of the present disclosure, an electronic device provided with a metal case may include a metal case in which at least one electronic circuit or antenna is formed; a metal pad provided on the metal case and electrically connected to the at least one electronic circuit or antenna; a metal sheet attached to a surface of the metal pad; and an electronic circuit board electrically connected to the at least one electronic circuit or antenna of the metal case through a metal member for connection detachably contacting the metal sheet.

The metal pad and the metal sheet may be bonded to each other by ultrasonic welding or electric resistance welding.

A plurality of bonding portions may be formed between the metal pad and the metal sheet.

The plurality of bonding portions may be formed around a central portion of the metal sheet.

The metal sheet may be formed in a rectangular shape, and corners of the metal sheet may be not provided with the plurality of bonding portions.

The plurality of bonding portions may include a fusion portion formed by melting a melt of the metal pad and a metal of the metal sheet.

The metal sheet may be fixed to the metal pad with a double-sided tape.

The metal member for connection may be formed in any one of a C-clip, a spring, a conductive pin, and a conductive columnar structure.

A portion of the metal member for connection contacting the metal sheet may be formed of one of gold, silver, platinum, tin, cobalt, copper, nickel, titanium, and the like or an alloy containing at least one of them.

A portion of the metal member for connection contacting the metal sheet may be coated with one of gold, silver, platinum, tin, cobalt, copper, nickel, titanium, and the like.

The metal sheet may be formed in a shape of a foil, a film, or a plate

The metal sheet may be formed of one of gold, silver, platinum, tin, nickel, cobalt, titanium, and copper or an alloy containing at least one of them.

A metal material including at least one of tin, zinc, silver, gold, indium, copper, bismuth, and nickel may be between the metal pad and the metal sheet.

According to another aspect of the present disclosure, a metal case may include: the metal case including a metal part being used as at least one electronic circuit or antenna and a polymer; a metal pad provided on the metal part of the metal case; and a metal sheet attached to a surface of the metal pad, wherein the metal sheet may be bonded to the metal pad by ultrasonic welding or electric resistance welding.

The metal sheet may be bonded to the metal pad by a plurality of bonding portions formed by the ultrasonic welding or the electric resistance welding.

The plurality of bonding portions may be formed around a contact portion formed at a center of the metal sheet.

The metal sheet may be temporarily fixed to the metal pad by a double-sided tape.

DESCRIPTION OF DRAWINGS

Figure 5:
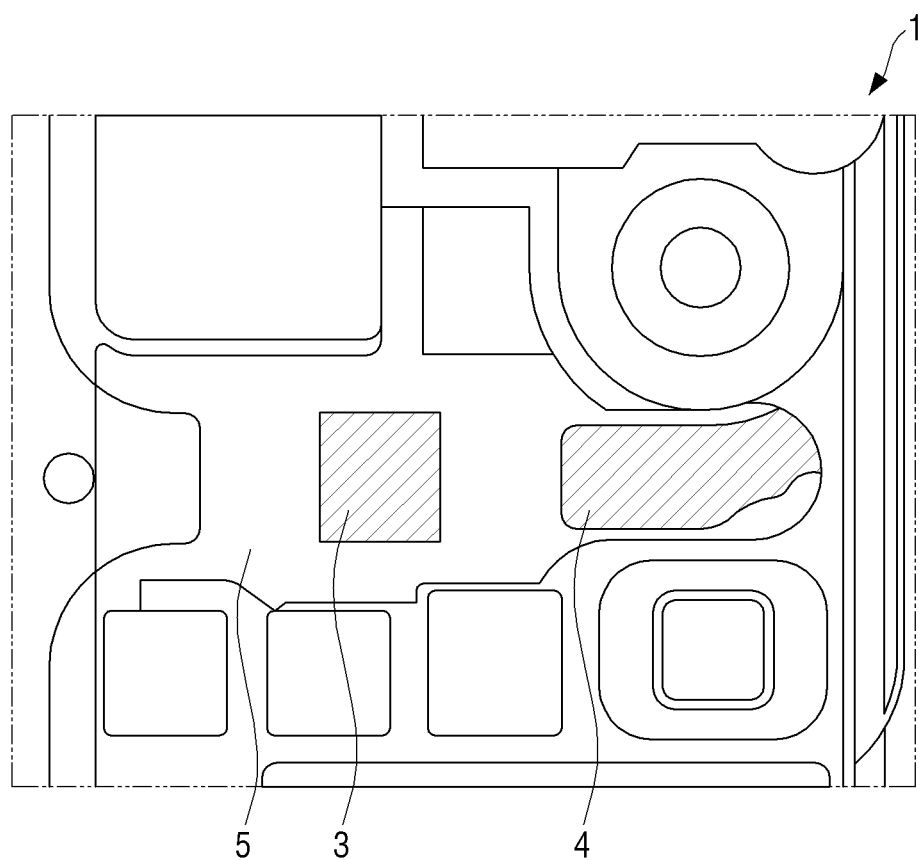
Figure 6:
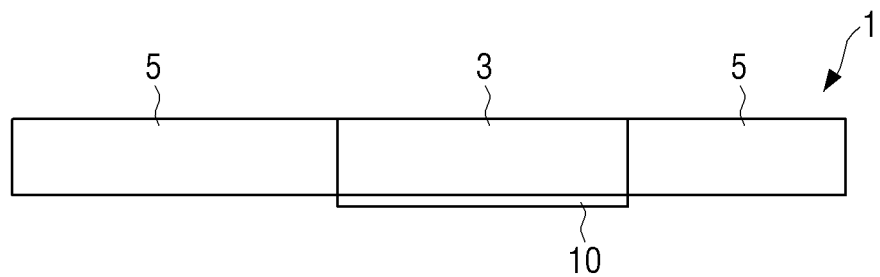
Figure 7:
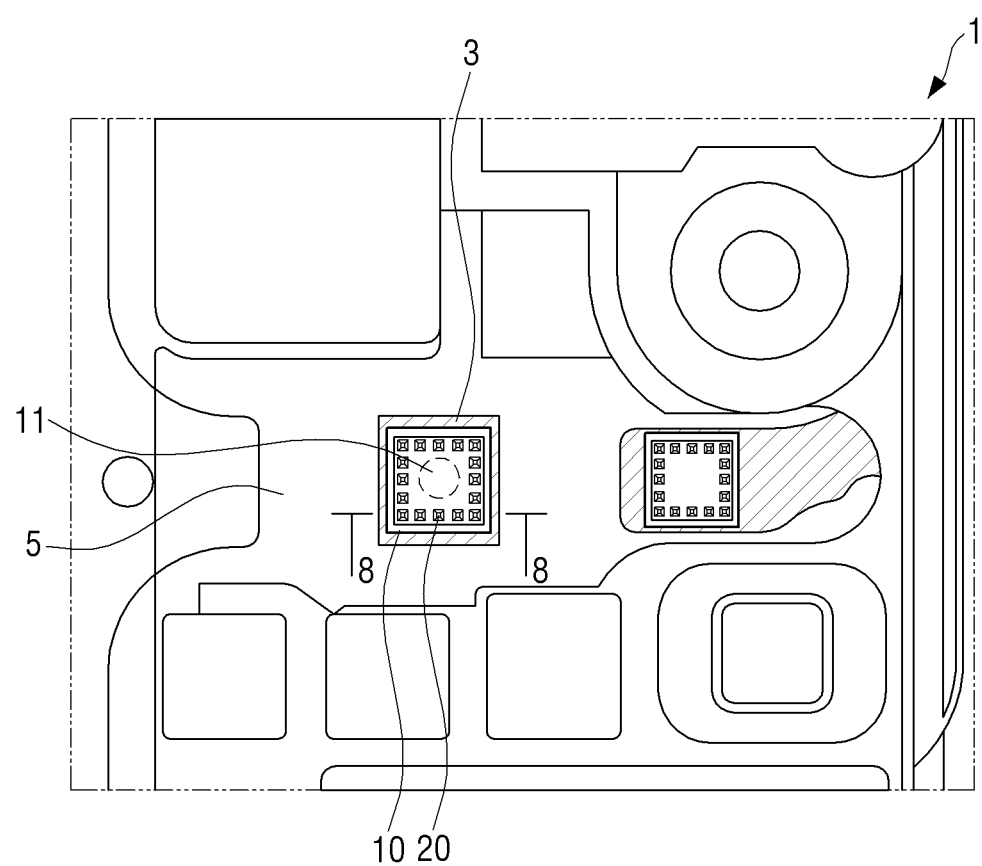
Figure 8:
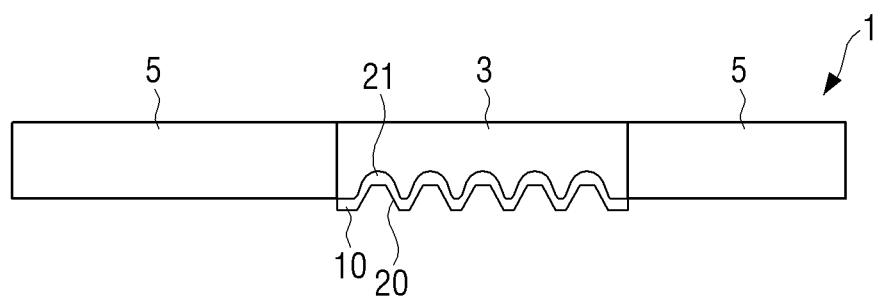
Figure 9:
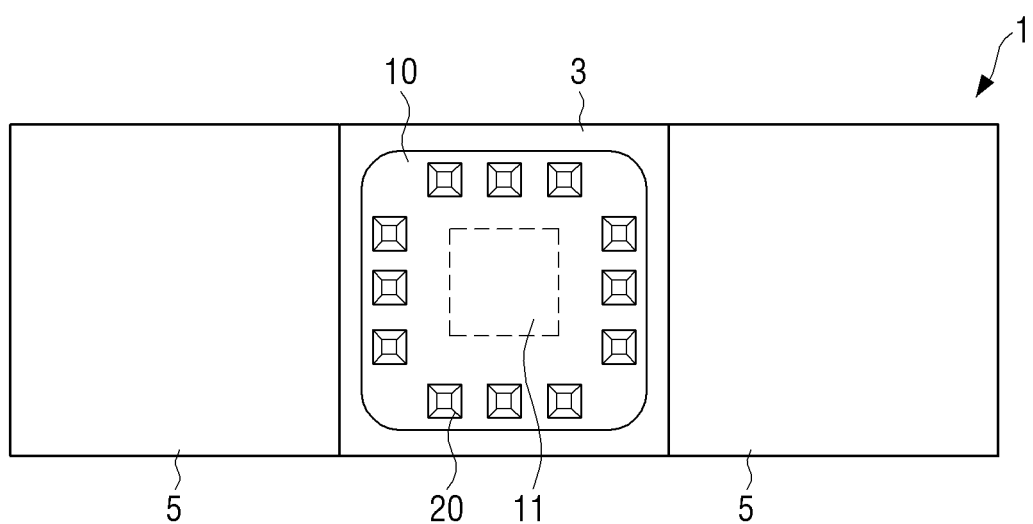
Figure 10:
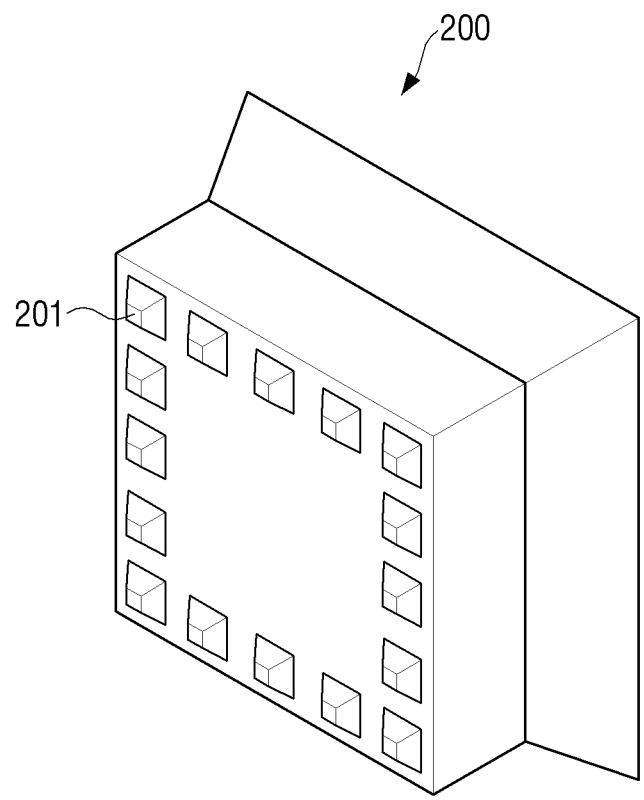
Figure 11A:
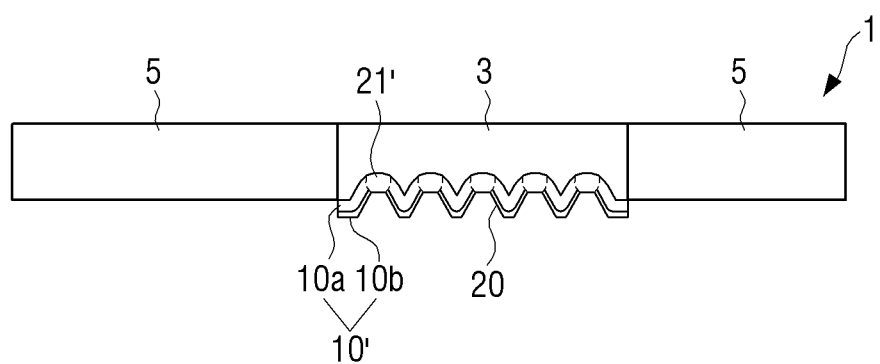
Figure 11B:
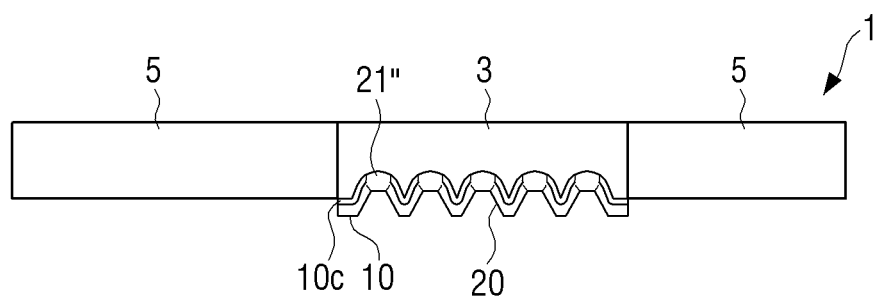
Figure 12A:
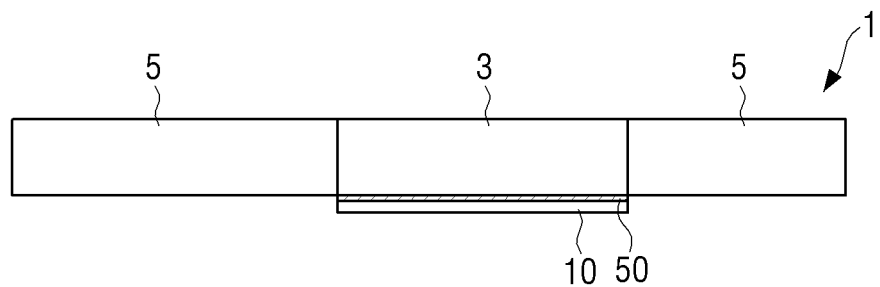
Figure 12B:
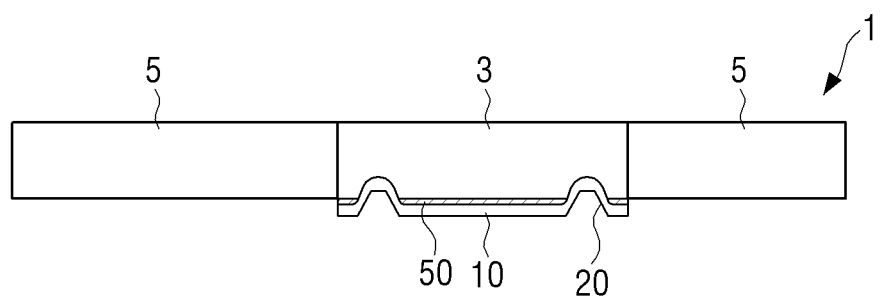
Figure 13:
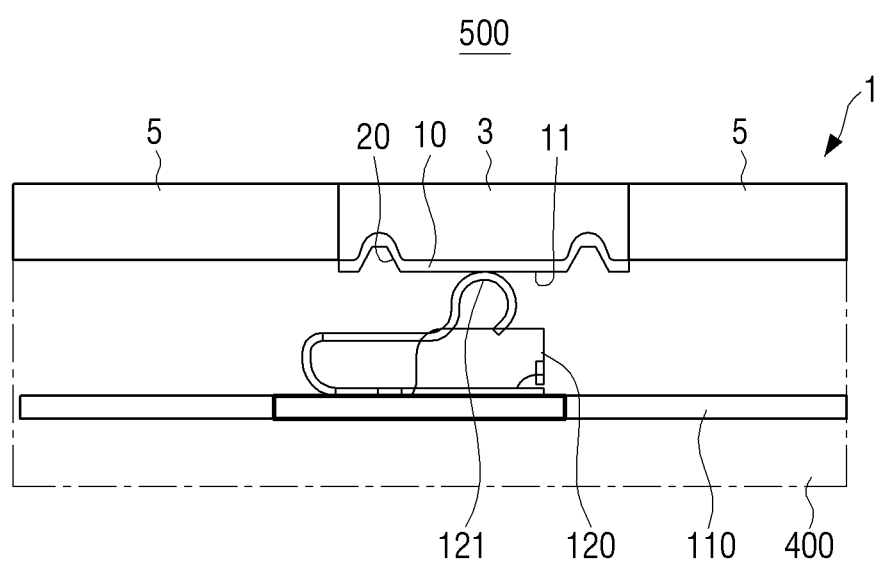

FIG. 1 is a view illustrating a structure for connecting a metal case and an electronic circuit board according to the prior art;

FIG. 2 is a view illustrating another structure for connecting a metal case and an electronic circuit board according to the prior art;

FIG. 3 is a view illustrating another structure for connecting a metal case and an electronic circuit board according to the prior art;

FIG. 4 is a view illustrating another structure for connecting a metal case and an electronic circuit board according to the prior art;

FIG. 5 is a partial plan view illustrating a metal case according to an embodiment of the present disclosure in which a metal sheet is not disposed;

FIG. 6 is a partial cross-sectional view conceptually illustrating a state where a metal sheet is placed on a metal pad of the metal case of FIG. 5;

FIG. 7 is a partial plan view illustrating a metal case according to an embodiment of the present disclosure;

FIG. 8 is a partial cross-sectional view illustrating the metal case of FIG. 7 according to the present disclosure taken along a line 8-8;

FIG. 9 is a partial plan view illustrating a metal case according to another embodiment of the present disclosure;

FIG. 10 is a partial perspective view illustrating an ultrasonic tool used for attaching a metal sheet to a metal pad of a metal case according to an embodiment of the present disclosure;

FIG. 11A and FIG. 11B are partial cross-sectional views illustrating another example of a metal sheet used in a metal case according to an embodiment of the present disclosure;

FIG. 12A is a view illustrating a state in which a metal sheet is temporarily attached to a metal pad of a metal case using a double-sided tape;

FIG. 12B is a view illustrating a state in which the metal sheet of FIG. 12A is bonded to the metal case by ultrasonic welding; and FIG. 13 is a partial cross-sectional view conceptually illustrating an electronic device having a metal case according to an embodiment of the present disclosure.

BEST MODE

Hereinafter, certain embodiments of an electronic device having a metal case according to the present disclosure and a metal case used therein will be described in detail with reference to the accompanying drawings.

It is to be understood that the embodiments described below are provided for illustrative purpose only, and that the present disclosure may be embodied with various modifications different form exemplary embodiments described herein. However, in the following description below, detailed description of well-known functions or components will be omitted when it may be unnecessary to obscure the subject matter of the present disclosure. Further, the accompanying drawings may be not drawn to scale in order to facilitate understanding of the invention, but the dimensions of some of the components may be exaggerated.

FIG. 5 is a partial plan view illustrating a metal case according to an embodiment of the present disclosure in which a metal sheet is not disposed, and FIG. 6 is a partial cross-sectional view illustrating a state where a metal sheet is placed on a metal pad of the metal case of FIG. 5. FIG. 7 is a partial plan view illustrating a metal case according to an embodiment of the present disclosure. FIG. 8 is a partial cross-sectional view illustrating the metal case of FIG. 7 according to the present disclosure taken along a line 8-8.

A metal case 1 used in an electronic device according to an embodiment of the present disclosure is illustrated in FIG. 5. The metal case 1 forms an appearance of the electronic device, and the metal case 1 may include a metal part and a polymer 5. An electronic circuit board 110 (see FIG. 13) may be provided below the metal case 1. The metal part may be formed as at least one electronic circuit or antenna. The electronic circuit or the antenna formed in the metal part needs to be electrically connected to the electronic circuit board 110. For this purpose, the metal part is provided with a metal pad 3 electrically connected to the electronic circuit or the antenna. The metal pad 3 may be provided in a number corresponding to the number of electronic circuits or antennas. For example, when four antennas are formed in the metal case 1 according to frequency bands, four metal pads 3 may be provided. The polymer 5 is placed between the plurality of electronic circuits or antennas so that the plurality of electronic circuits or antennas are insulated from each other.

FIG. 5 is a view for showing two metal pads 3 and 4 exposed in the metal case 1. FIG. 5 is a partial plan view illustrating the metal case 1 of an electronic device, for example, the metal case 1 of a mobile electronic device in which a plurality of antennas are formed. The two metal pads 3 and 4 are electrically connected to the metal parts of the metal case 1 formed as the antennas or electronic circuits, respectively. Further, the two metal pads 3 and 4 are surrounded by non-conductive polymer 5 and are insulated from each other. Here, the mobile electronic device may include a smartphone, a tablet computer, a notebook computer, a wearable device, and the like.

FIG. 6 illustrates a state in which a metal sheet 10 is placed on the metal pad 3 of the metal case 1 of FIG. 5, but the metal sheet 10 is not attached to the exposed surface of the metal pad 3 by ultrasonic welding or electric resistance welding.

The metal sheet 10 is attached to the exposed surface of the metal pad 3 to prevent galvanic corrosion or fretting corrosion that occurs when the metal pad 3 is in directly contact with a metal member for connection 120 provided on the electronic circuit board 110. The metal sheet 10 may be formed in a shape corresponding to the metal pad 3 in the form of a foil, a film, or a plate. For example, the metal sheet 10 may be formed in various shapes corresponding to the metal pad such as quadrangle, rectangle, square, circle, and the like. In the case of the present embodiment, the metal sheet 10 is formed in a foil having a substantially square shape.

In addition, the metal sheet 10 may be formed of at least one of metals such as gold, silver, platinum, tin, nickel, cobalt, copper, titanium, and the like, and alloys containing at least one of these metals. Alternatively, the metal sheet 10 may be formed by coating a metal plate having conductivity with the above-described metals. As an example, the metal sheet 10 may be formed by coating a copper plate with one of gold, silver, platinum, tin, nickel, and cobalt. In detail, the metal sheet 10 may be formed by coating one metal of gold, silver, platinum, nickel, tin and cobalt or an alloy containing at least one of these metals on a copper plate having a predetermined thickness in the range of 0.018 mm to 0.050 mm with one layer or a plurality of layers. At this time, the coating layer may be formed to have a thickness of 0.01 mm or less.

In order to prevent galvanic corrosion and fretting corrosion, the metal sheet 10 may be made of a metal having the same or superior corrosion resistance as and a strength similar to or stronger than the metal of the contact portion of the metal member for connection 120 of the electronic circuit board 110.

FIG. 7 is a partial cross-sectional view illustrating a case where the metal sheet 10 of FIG. 6 is bonded to the metal pads 3 and 4 of the metal case 1. The metal sheet 10 is bonded to the metal pads 3 and 4 by ultrasonic welding or electric resistance welding.

The metal sheet 10 and the metal pad 3 are bonded by a plurality of bonding portions 20 when the metal sheet 10 is bonded to the metal pad 3 by ultrasonic welding. The plurality of bonding portions 20 are formed in a concave groove shape as illustrated in FIG. 8, respectively. The shape of each of the plurality of bonding portions 20 is formed in a shape corresponding to a plurality of protrusions 201 of an ultrasonic tool 200 as illustrated in FIG. 10. In the case of the present embodiment, since the protrusions 201 of the ultrasonic tool 200 are formed in a substantially quadrangular pyramidal shape, each of the plurality of bonding portions 20 is formed in a groove having a shape corresponding to the quadrangular pyramidal shape.

Further, each of the plurality of bonding portions 20 may include a fusion portion 21 in which the metal of the metal pad 3 and the metal of the metal sheet 10 are melted and interatomic bonding is generated. When the metal sheet 10 is bonded to the metal pad 3 by ultrasonic welding, ultrasonic vibration is applied to the ultrasonic tool 200 as illustrated in FIG. 10 to form a plurality of concave bonding portions 20 on the metal sheet 10 so that the metal sheet 10 is bonded to the metal pad 3.

At this time, the plurality of bonding portions 20 are arranged along the edge of the substantially square metal sheet 10 as illustrated in FIG. 7, and the bonding portion 20 is not formed at the central portion 11. When the metal sheet 10 has a circular shape, the plurality of bonding portions 20 are arranged along the edge of the circle and the bonding portion is not formed at the central portion. The central portion 11 of the metal sheet 10 without the bonding portion 20 is used as a contact region with which the metal member for connection 120 provided on the electronic circuit board 110 is in contact. Accordingly, the plurality of bonding portions 20 formed by ultrasonic welding are formed around the contact region 11 provided at the center of the metal sheet 10.

As another example, in the case in which the metal sheet 10 is formed in a substantially square shape and has rounded corners, the bonding portions 20 may not be formed at the corners of the metal sheet 10 as illustrated in FIG. 9.

FIG. 11a illustrates a case where a metal sheet 10' having a coating layer 10b in which one of gold, silver, platinum, tin, nickel, cobalt and titanium is coated on a top surface, a bottom surface or both surfaces of a conductive metal plate 10a such as a copper plate is bonded to the metal pad 3 of the metal case 1 by ultrasonic welding.

As illustrated in FIG. 11a, the metal sheet 10' is bonded to the metal pad 3 by a plurality of bonding portions 20 formed by the ultrasonic welding. At this time, the plurality of bonding portions 20 may include a fusion portion 21' in which a part of a metal constituting the metal sheet 10 and a part of a metal constituting the metal pad 3 are fused with each other.

FIG. 11b illustrates a case where a metal layer 10c is formed between the metal pad 3 of the metal case 1 and the metal sheet 10 in order to facilitate the bonding of the metal pad 3 and the metal sheet 10.

The metal layer 10c may be formed of at least one metal of tin, zinc, silver, gold, copper, indium, bismuth and nickel or an alloy including at least one of these metals. Further, the metal layer 10c may be formed as a thin plate separately formed from the metal sheet 10 or may be formed as a coating layer on the exposed surface of the metal pad 3 or on one surface of the metal sheet 10. In the case of the present embodiment, the metal layer 10c is formed as a coating layer on the exposed surface of the metal pad 3.

In the case of FIG. 11b, when the metal sheet 10 is bonded to the metal pad 3 of the metal case 1 by ultrasonic welding, the metal sheet 10 and the metal pad 3 are bonded to each other by the plurality of bonding portions 20. At this time, a metal forming the metal layer 10c is melted together with the fusion portions 21' of the plurality of bonding portions 20, so that the bonding of the metal pad 3 and the metal sheet 10 may be facilitated.

FIG. 12a is a view illustrating a state in which the metal sheet 10 is temporarily attached to the metal pad 3 of the metal case 1 using a double-sided tape 50, and FIG. 12b is a view illustrating a state in which the metal sheet 10 of FIG. 12a is bonded to the metal pad 3 of the metal case 3 by ultrasonic welding.

When the metal sheet 10 is bonded to the metal pad 3 of the metal case 1 according to the present disclosure, before the metal sheet 10 is bonded to the metal pad 3 by ultrasonic welding, the metal sheet 10 may be temporarily fixed to the metal pad 3 with the double-sided tape 50 as illustrated in FIG. 12a so that the metal sheet 10 is stably attached to the metal pad 3 without falling off. If the metal sheet 10 is temporarily fixed with the double-sided tape 50 as described above, the metal sheet 10 may be prevented from moving relative to the metal pad 3 when ultrasonic welding is performed, thereby minimizing the occurrence of welding defects.

On the other hand, when the metal sheet 10 is bonded to the metal pad 3 by ultrasonic welding, as illustrated in FIG. 12b, the double-sided tape 50 does not exist in the plurality of bonding portions 20 for bonding the metal sheet 10 and the metal pad 3.

The metal case 1 according to an embodiment of the present disclosure having the above-described structure may be used in various electronic devices.

FIG. 13 is a partial cross-sectional view conceptually illustrating an electronic device having a metal case according to an embodiment of the present disclosure.

Referring to FIG. 13, an electronic device 500 having a metal case according to an embodiment of the present disclosure may include a metal case 1 and an electronic circuit board 110.

The metal case 1 may include a metal part where at least one electronic circuit or antenna is formed. The at least one electronic circuit may be a passage through which current flows or a passage for signal transmission. In addition, the at least one antenna may be formed so that a controller formed on the electronic circuit board 110 wirelessly communicates with an external device. When the controller formed on the electronic circuit board 110 is configured to be capable of wireless communication with the external device using a plurality of frequency bands, the metal case 1 may be provided with a plurality of antennas corresponding to the plurality of frequency bands.

The at least one electronic circuit or antenna provided in the metal case 1 may include a metal pad 3 electrically connected thereto. The metal pad 3 connects the electronic circuit board 110 formed separately from the metal case 1 and the at least one electronic circuit or antenna formed in the metal case 1 and may be formed of a conductive metal. The metal pad 3 is the same as the metal pad 3 of the metal case 1 as described above, and thus a detailed description thereof is omitted.

The metal sheet 10 is attached to one surface of the metal pad 3, that is, the exposed surface of the metal pad 3. The metal sheet 10 is for preventing galvanic corrosion or fretting corrosion from occurring due to direct contact of the metal pad 3 with the metal member for connection 120 provided on the electronic circuit board 110, and is permanently bonded to the metal pad 3 by ultrasonic welding or electric resistance welding. The structure in which the metal sheet 10 is bonded to the metal pad 3 is the same as that of the metal case 1 as described above, so a detailed description of the bonding structure of the metal sheet 10 and the metal pad 3 is omitted.

The electronic circuit board 110 is electrically connected to the at least one electronic circuit or antenna formed in the metal case 1. The metal member for connection 120 is provided on the electronic circuit board 110 to connect the electronic circuit board 110 to the metal case 1.

The metal member for connection 120 electrically connects the at least one electronic circuit or antenna provided in the metal case 1 to the electronic circuit board 110, and is formed to be in detachably contact with the metal sheet 10 bonded to the metal pad 3 of the metal case 1. FIG. 13 illustrates a state in which the metal member for connection 120 is in contact with the metal sheet 10 of the metal case 1. When the metal case 1 is separated from the electronic device 500, the metal sheet 10 of the metal case 1 is separated from the metal member for connection 120 of the electronic circuit board 110.

The metal member for connection 120 provided on the electronic circuit board 110 may be formed in any one of a C-clip, a spring, a conductive pin, a conductive columnar structure. In the case of the embodiment as illustrated in FIG. 13, a C-clip is used as the metal member for connection 120. When the C-clip is used as the metal member for connection 120, a contact portion 121 of the C-clip 120 is in elastically contact with the metal sheet 10 bonded to the metal case 1, so that the contact between the metal sheet 10 and the contact portion 121 of the C-clip 120 may be stably maintained.

The metal member for connection 120 is formed of a metal having good electrical conductivity. The portion 121 which is in contact with the contact part 11 of the metal sheet 10 may be made of one metal of gold, silver, platinum, tin, cobalt, copper, nickel, titanium, and the like or an alloy containing at least one of these metals.

In another embodiment, the metal member for connection 120 may be formed of a metal having good electrical conductivity, and the contact portion 121 of the metal member for connection 120 which is in contact with the contact part 11 of the metal sheet 10 may be coated with one metal of gold, silver, platinum, tin, cobalt, copper, and the like.

The electronic circuit board 110 may be formed variously according to the type of the electronic device 500. For example, when the electronic device 500 is a smartphone, the electronic circuit board 110 is disposed on the rear side of a display 400 and may be configured to perform functions of a general smartphone such as, for example, voice call, internet connection, application execution, photographing, and the like. At this time, the electronic circuit board 110 may be disposed between the metal case 1 and the display 400.

When the smartphone is connected to an external device through LTE, WiFi, Bluetooth, etc., the metal case 1 may be provided with an antenna for LTE connection, an antenna for WiFi connection, and an antenna for Bluetooth connection. They may be connected to the electronic circuit board 110 by the contact between the metal sheet 10 bonded to the metal pad 3 provided on each of them and the metal member for connection 120.

As described above, with the electronic device having the metal case according to an embodiment of the present disclosure, since the metal sheet bonded to the metal pad of the metal case is made of a metal having little or no potential difference from the metal of the contact portion of the metal member for connection provided on the electronic circuit board, galvanic corrosion may be prevented from occurring at the contact portion between the metal sheet and the metal member for connection.

Further, with the electronic device having the metal case according to an embodiment of the present disclosure, since the metal sheet bonded to the metal pad of the metal case is made of a metal having the same or stronger strength as the metal of the contact portion of the metal member for connection provided on the electronic circuit board, fretting corrosion may be prevented from occurring at the contact portion between the metal sheet and the metal member for connection.

In addition, with the electronic device having the metal case according to an embodiment of the present disclosure, the thin metal sheet is bonded to the metal pad of the metal case by ultrasonic welding or electric resistance welding. Therefore, the assembling work may be convenient and the electronic device may be made thinner compared to the prior art in which the metal case and the electronic circuit board are attached to each other using a bolt or a screw.

The present disclosure has been described above by way of example. The terms used herein are for the purpose of description and should not be construed as limiting. Various modifications and variations of the present disclosure are possible in light of the above descriptions. Therefore, the present disclosure can be freely carried out within the scope of the claims unless otherwise specified.

What is claimed is:
1. An electronic device, comprising:
a metal case in which at least one electronic circuit or antenna is formed;
a metal pad provided on the metal case and electrically connected to the at least one electronic circuit or antenna;
a metal sheet attached to one surface of the metal pad and having a shape corresponding to the metal pad; and
an electronic circuit board electrically connected to the at least one electronic circuit or antenna of the metal case through a metal member for connection detachably contacting the metal sheet,
wherein the metal sheet is made of a metal having same or smaller electro potential than a metal of a contact portion of the metal member for connection,
wherein the metal sheet is formed of one of gold, silver, platinum, tin, nickel, cobalt, titanium, and copper or an alloy containing at least one of them,
wherein the contact portion of the metal member for connection is formed of one of gold, silver, platinum, tin, cobalt, copper, nickel, titanium or an alloy containing at least one of them,
wherein a plurality of bonding portions are formed between the metal pad and the metal sheet, each bonding portion formed in a quadrangular pyramidal shape including a concave depression formed in the metal pad and the metal sheet penetrating through a surface plane of the metal pad,
wherein the plurality of bonding portions is disposed circumferentially surrounding a central portion of the metal sheet, and the metal member contacts the central portion of the metal sheet to electrically connect to the at least one electronic circuit or the antenna,
wherein the plurality of bonding portions each includes a fusion portion in which the metal pad and the metal sheet are melted and inter-atomically bonded to each other, and
wherein each of the plurality of bonding portions includes at a center thereof a fusion portion in which the metal pad is melted together with the metal sheet, and a non-fusion portion in which the metal pad and the metal sheet are attached in absence of melting.

2. The electronic device of claim 1, wherein the plurality of bonding portions is disposed in rows, each row parallel to a nearest respective edge of the metal sheet, to circumferentially surround the central portion.

3. The electronic device of claim 1, wherein the plurality of bonding portions is formed around a central portion of the metal sheet.

4. The electronic device of claim 1, wherein the metal sheet is formed in a shape of a foil, a film, or a plate.

* * * * *